United States Patent
Yi et al.

[11] Patent Number: 5,874,831
[45] Date of Patent: Feb. 23, 1999

[54] MAGNETIC RESONANCE IMAGING (MRI) SYSTEM

[75] Inventors: Jeong-han Yi, Seoul; Won Yi, Sungnam; Jung-hoe Kim, Seoul; Soo-yeol Lee, Chungju, all of Rep. of Korea

[73] Assignee: Samsung Electronics Co., Ltd., Suwon, Rep. of Korea

[21] Appl. No.: 805,179

[22] Filed: Feb. 26, 1997

[30] Foreign Application Priority Data

Feb. 26, 1996 [KR] Rep. of Korea .................. 96-4684

[51] Int. Cl.⁶ .................................................. G01V 3/00
[52] U.S. Cl. .......................................... 324/318; 324/322
[58] Field of Search .................................. 324/300, 306, 324/307, 309, 318; 600/410

[56] References Cited

U.S. PATENT DOCUMENTS

| | | | |
|---|---|---|---|
| 5,166,619 | 11/1992 | Ries | 324/318 |
| 5,198,769 | 3/1993 | Frese et al. | 324/318 |
| 5,225,780 | 7/1993 | Riederer et al. | 324/309 |
| 5,581,187 | 12/1996 | Pausch | 324/318 |
| 5,675,255 | 10/1997 | Sellers et al. | 324/318 |

*Primary Examiner*—Louis Arana
*Attorney, Agent, or Firm*—Foley & Lardner

[57] ABSTRACT

A magnetic resonance imaging (MRI) system includes a computer for performing overall control and signal processing, a pulse generator for generating a predetermined RF pulse signal and a gradient field pulse signal having variable intensities, a main magnet for generating a static magnetic field, a gradient field coil having a cylindrical dish-like structure surrounding a magnetic pole of the main magnet for generating a gradient field based on the gradient field pulse signal, an RF coil for transmitting a RF field according to the RF pulse signal to an imaging object and receiving MR signals from the imaging object, and an analog-to-digital converter for converting the MR signals from the RF coil into digital signals and outputting the converted digital signals to the computer. The influence of the reverse magnetic field generated from the reverse circulation portion of the gradient field coil is reduced whereby the linear gradient field region and an image region thereof are enlarged, and gradient field coils can be attached stably to magnetic poles whereby vibration and noise are reduced.

3 Claims, 3 Drawing Sheets

MAGNETIC RESONANCE IMAGING (MRI) SYSTEM

BACKGROUND OF THE INVENTION

The present invention relates to a magnetic resonance imaging system, and more particularly, to a magnetic resonance imaging system having an advanced magnetic gradient field coil.

A magnetic resonance imaging (MRI) system for examining a tissue type of the human body applies a gradient field of varying intensities to the human body, to thereby display the arrangement of nuclear spins of bodily tissue. That is, when a radio frequency (RF) pulse wave within a strong static magnetic field is applied to the human body, the nuclear spins of bodily tissue are excited and magnetic resonance (MR) signals are generated when the gradient magnetic field appropriate for bodily tissue is applied. By image-processing the above magnetic resonance signals, the type of the bodily tissue can be examined.

FIG. 1 is a schematic diagram showing a conventional magnetic resonance imaging (MRI) system. As shown in FIG. 1, the conventional MRI system is provided with a computer 11 for performing overall control and signal processing, a pulse generator 12 for generating RF pulse signals and gradient pulse signals having variable intensities, according to control signals of the computer 11, a main magnet 13 having a C-type structure and for generating a static magnetic field $B_0$, a disk-shaped gradient magnetic coil 14 attached to two magnetic-polar surfaces of the main magnet 13 and for generating a gradient field according to the gradient field pulse signals, an RF coil 15 for emitting oscillation waves according to the RF pulse signal to an imaging object and receiving MR signals from the imaging object, and an analog-to-digital converter 16 for converting the MR signals from the RF coil 15 into digital signals and outputting the converted digital signals to the computer 11.

The RF coil 15 can be divided into a transmitting portion (not shown) and a receiving portion (not shown). The region represented by the slashed oval between the upper and lower gradient field coils 14 represents a region for an imaging object, for example, the region where a patient is positioned. In the region, the static magnetic field $B_0$ from the main magnet 13 and the gradient field from the gradient field coil 14 are applied. Here, the gradient field coils 14 are provided in pairs with respect to each of the X-, Y- and Z-axes, respectively.

The pulse generator 12 generates RF pulse signals and gradient field pulses with respect to the three pairs of gradient magnetic coil 14. Accordingly, the transmitting portion of the RF coil 15 transmits a RF magnetic field according to the RF pulse signal to the imaging object, and the gradient field coils 14 generate a gradient field according to the gradient field pulse signals. Also, the receiving portion of the RF coil 15 receives the MR signals from the imaging object and then outputs the received MR signals to the analog-to-digital converter 16. When the computer 11 processes the MR data from the analog-to-digital converter 16, the arrangement of the nuclear spins of bodily tissue can be transformed into the MR image.

FIG. 2 is an example of the X-axis gradient field coil of FIG. 1. Here, reference numeral 141 denotes an X-axis upper gradient field coil and reference numeral 142 denotes an X-axis lower gradient field coil. The X-axis upper and lower gradient field coils 141 and 142 have a disc-like structure. The Y-axis gradient field coils (not shown) also have a disc-like structure. That is, the Y-axis upper and lower gradient field coils are rotated 90° with respect to the X-axis upper and lower gradient field coils 141 and 142 around the Z-axis. The Z-axis upper and lower gradient field coils (not shown) are formed of concentric-circular coils on the disc of the X-axis upper and lower gradient field coils 141 and 142. Here, current directions of the Z-axis upper and lower gradient field coils oppose each other.

As shown in FIG. 2, the upper gradient field coil 141 and the lower gradient field coil 142 consist of two semi-disc-like coils, respectively. That is, the gradient field coil of one axis has four semi-disc-like coils. Here, they are connected in parallel and/or in series, to thereby be supplied with gradient field pulse from the pulse generator 12 of FIG. 1. Each semi-disc-like coil is divided into a gradient field portion of many strands, which cross the inside of the semicircle, and a reverse circulation portion located along the perimeter of the semicircle. The currents of strands of the gradient field portion meet with that of the reverse circulation portion. Here, the gradient field generated from the gradient field portion of each semi-disc-like coil enlarges a linear gradient field of the image region. However, a reverse magnetic field generated from the reverse circulation portion reduces the linear gradient field. The magnetic field direction of the linear gradient field is the same as that of the static magnetic field $B_0$ of FIG. 1. Accordingly, enlarging/reducing the linear gradient field represents actual enlargement/reduction of the image region.

In the above conventional MRI system, since the gradient field coil is disc-shaped, the strong influence of the reverse magnetic field reduces the linear gradient field and the image region thereof. Also, in order to enlarge the image region, a polar surface of the main magnet should be enlarged, increasing cost. Furthermore, vibration and acoustic noise occurring between the gradient field coil and the magnetic pole of the main magnet is severe.

SUMMARY OF THE INVENTION

Accordingly, it is an object of the present invention to provide a magnetic resonance imaging (MRI) system wherein the influence of a reverse magnetic field and vibration and noise can be reduced.

To accomplish the above object, there is provided a magnetic resonance imaging (MRI) system comprising: a computer for performing overall control and signal processing; a pulse generator for generating a predetermined RF pulse signal and a gradient field pulse signal having variable amplitudes; a main magnet for generating a static magnetic field; a gradient field coil having a cylindrical dish-like structure surrounding a magnetic pole of the main magnet for generating a gradient field based on the gradient field pulse signal; an RF coil for transmitting a RF field according to the RF pulse signal to an imaging object and receiving MR signals from the imaging object; and an analog-to-digital converter for converting the MR signals from the RF coil into digital signals and outputting the converted digital signals to the computer.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE invention

Figure 1:
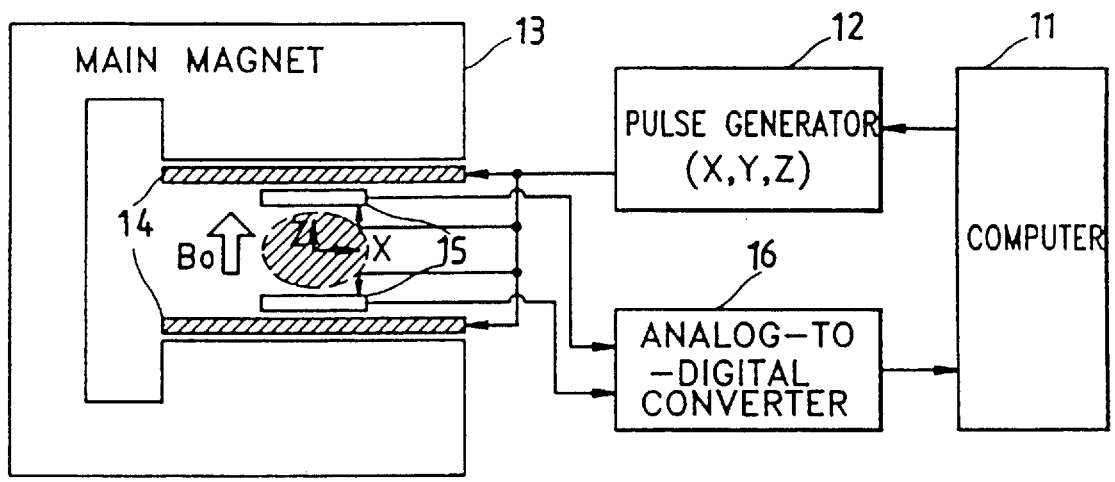
FIG. 1 is a schematic diagram of a conventional magnetic resonance imaging (MRI) system.
Figure 2:
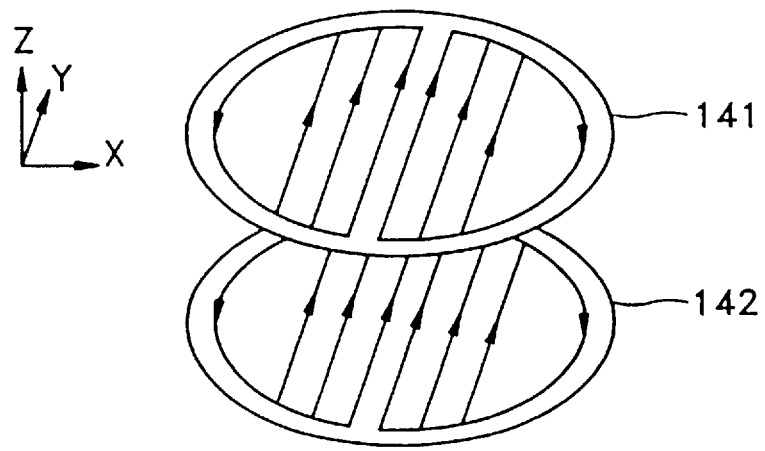
FIG. 2 is an illustration of X-axis gradient field coils of FIG. 1.
Figure 3:
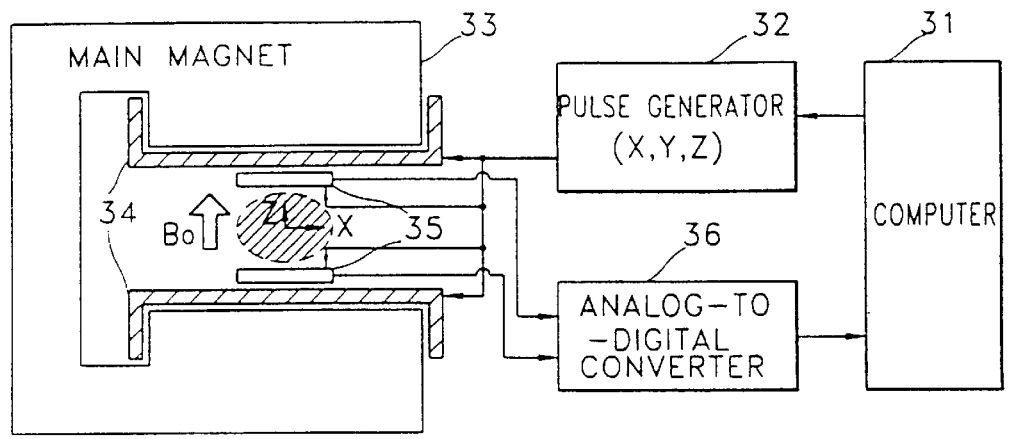
FIG. 3 is a schematic diagram of a MRI system according to the present invention.

Referring to FIG. 3, a magnetic resonance imaging (MRI) system according to the present invention is provided with a computer 31 for performing overall control and signal processing, a pulse generator 32 for generating a predetermined RF pulse signal and a gradient magnetic pulse signal having variable intensities according to a control signal from the computer 31, a main magnet 33 of a cylindrical dish-like structure for generating a static magnetic field $B_0$, gradient field coils 34 having a cylindrical dish shape surrounding two magnetic poles of the main magnet 33 for producing a gradient field based on the gradient field pulse signal, a radio frequency (RF) coil 35 for transmitting a RF field according to the RF pulse signal to an imaging object and receiving MR signals from the imaging object, and an analog-to-digital converter 36 for converting the MR signals from the RF coil 35 into digital signals and outputting the converted digital signals to the computer 31.

A region represented by the slashed oval between the upper and lower gradient field coils 34 denotes a region for an imaging object, for example, an image region where a patient is positioned. In the image region, with the static magnetic field $B_0$ from the main magnet 33, the gradient fields from the gradient magnetic coils 34 are applied. The pulse generator 32 includes a predetermined RF and gradient field pulse amplifying circuits, and the analog-to-digital converter 36 includes a predetermined RF circuit and a signal collection circuit. Here, the gradient field coils 34 are provided in pairs with respect to the X-, Y- and Z-axes respectively, described in detail later.

The pulse generator 32 generates the RF pulse signal and the gradient field pulse with respect to the three pairs of gradient field coils 34. Accordingly, a transmitting portion of the RF coil 35 transmits the RF field according to the RF pulse signal to the imaging object, and the gradient field coil 34 generates the gradient field according to the gradient pulse signal. Also, a receiving portion of the RF coil 35 receives the MR signals from the imaging object and outputs the received MR signals to the analog-to-digital converter 36. When the computer 31 processes the MR data from the analog-to-digital converter 36, the arrangement of the nuclear spins of bodily tissue can be transformed into the MR image.

Figure 4:
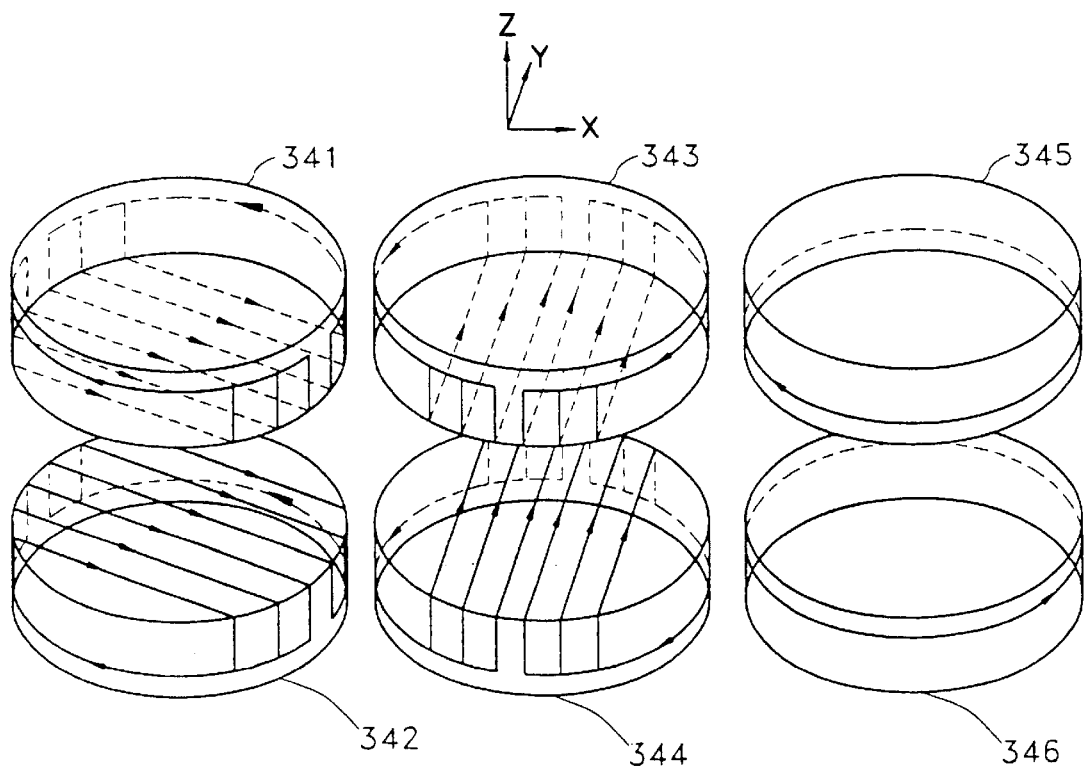
FIG. 4 is an illustration of gradient field coils of FIG. 3.

Referring to FIG. 4, the X-axis upper and lower gradient field coils 341 and 342 have a cylindrical dish shape. The current directions of the X-axis upper and lower gradient field coils 341 and 342 are the same. The Y-axis gradient field coils 343 and 344 also have a cylindrical dish shape. The Y-axis upper and lower gradient field coils 343 and 344 are rotated 90° with respect to the X-axis upper and lower gradient magnetic coils 341 and 342 centering around the Z-axis. The Z-axis gradient field coils 345 and 346 have a reverse Helmholtz pair structure where the current direction of the upper gradient field coil 345 is different from that of the lower gradient field coil 346, and the two coils are spaced by a predetermined distance. The three upper gradient field coils 341, 343 and 345 are stacked and attached to the upper magnetic pole of the main magnet 33, and the three lower gradient field coils 342, 344 and 346 are stacked and attached to the lower magnetic pole of the main magnet 33.

As shown in FIG. 4, the upper gradient field coil 341 and the lower gradient field coil 342 are formed of two semi-cylindrical coils, respectively. That is, one axis has four semi-cylindrical gradient field coils. Here, they are connected in parallel and/or in series, to thereby be supplied with the gradient field pulse from the pulse generator 32 of FIG. 3. Each semi-cylindrical coil is divided into a gradient field portion of plural strands, which cross the top or bottom of the semi-cylindrical portion, and a reverse circulation portion placed on the side of the semi-cylindrical portion. The upper gradient field coil 341 and the lower gradient magnetic coil 342 are arranged back-to-back relative to each other. Accordingly, the distance between the reverse circulation portions with respect to the linear gradient fields is increased, so that the influence of the reverse magnetic field is reduced.

Figure 5:
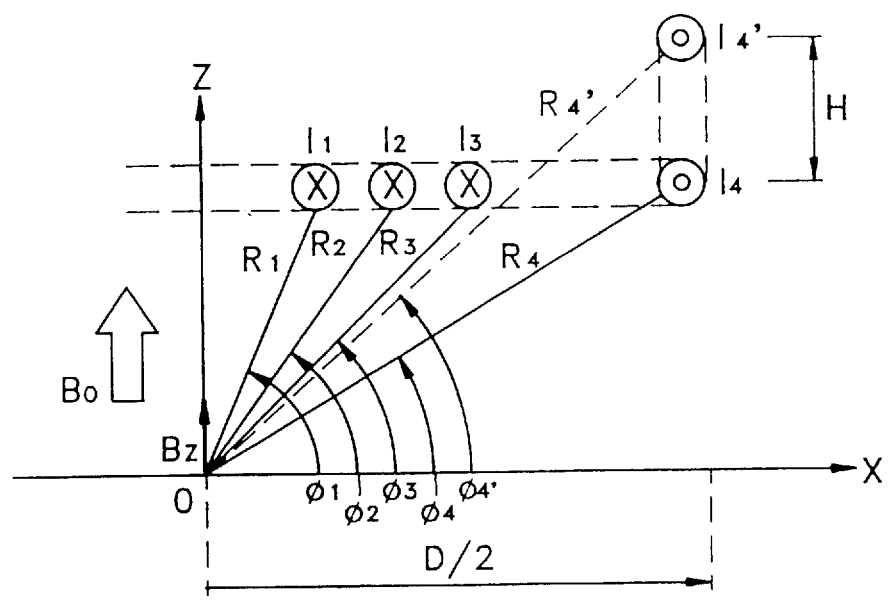
FIG. 5 is a sectional view of a semicircular coil of FIG. 4.

Referring to FIG. 5, $B_0$ represents the static magnetic field from the main magnet 33 of FIG. 3, and $B_z$ represents a linear gradient field of the same direction as that of the static magnetic field $B_0$. In the conventional disc-shaped gradient field coil, three strands of the gradient field portion are spaced by distances of $R_1$, $R_2$ and $R_3$ and the reverse circulation portion of one strand is spaced by $R_4$, where zero of the linear gradient field is a reference point, and the reference point, the gradient field portion and the reverse circulation portion are placed on the same plane. Here, the magnetic flux density of the linear gradient field $B_z$ at the reference point 0 can be expressed by the formula, $$B_z = \frac{\mu_0}{2\pi} \left[ \frac{I_1 \cos\phi_1}{R_1} + \frac{I_2 \cos\phi_2}{R_2} + \frac{I_3 \cos\phi_3}{R_3} - \frac{I_4 \cos\phi_4}{R_4} \right]$$

where it is assumed that the currents of $I_1$, $I_2$, $I_3$ and $I_4$ flow on infinite straight lines. Here, $\mu_0$ denotes the permeability, $I_1$, $I_2$ and $I_3$ denote currents passing through the gradient field portion of the three strands, and $I_4$ denotes the current passing through the reverse circulation portion of one strand, where $I_4=I_1+I_2+I_3$. Also, $R_1$, $R_2$ and $R_3$ denote the distances between the reference point 0 and the gradient field portion of the three strands, respectively, and $R_4$ denotes the distance between the reference point 0 and the reverse circulation portion of one strand, $\phi_1$, $\phi_2$ and $\phi_3$ denote the angles between the reference point 0 and the gradient field portion of the three strands and $\phi_4$ denotes the angle between the reference point 0 and the reverse circulation portion of one strand. Meanwhile, in the cylindrical dish structure gradient field coil 341, for example, shown in FIG. 4, the gradient field portion of the three strands are spaced by distances $R_1$, $R_2$ and $R_3$, and the reverse circulation portion of one strand on different plane is spaced by distance $R_4'$, and placed on different planes, respectively. Here, the magnetic flux density of the linear gradient field $B_z$ at the reference point can be expressed by the formula, $$B_z = \frac{\mu_0}{2\pi} \left[ \frac{I_1 \cos\phi_1}{R_1} + \frac{I_2 \cos\phi_2}{R_2} + \frac{I_3 \cos\phi_3}{R_3} - \frac{I_4' \cos\phi_4'}{R_4'} \right]$$

where it is assumed that currents $I_1$, $I_2$, $I_3$ and $I_4'$ flow on infinite straight lines. Here, $I_4$ and $I_4'$ are the same and $\phi_4 < \phi_4'$ and $R_4 < R_4'$. Accordingly, the magnetic flux density of the linear gradient magnetic field $B_z$ at the reference point 0 increases relatively.

In order to enlarge the linear gradient field in FIG. 5, the magnetic flux density must be increased. Here, the amount of current passing through the gradient field portion of the three strands, i.e., $I_1+I_2+I_3$ is as much as that of current $I_4$ passing through the reverse circulation portion of one strand, so that changed current intensity does not increase the magnetic flux density. Accordingly, in order to increase the magnetic flux density, $R_4$ and $\phi_4$ must be increased. However, in the case of the conventional disc-shaped gradient field coil, $R_4$ and $\phi_4$ are limited by the diameter D of a concerned disc. On the other hand, in the case of the cylindrical dish structured gradient field coil shown in FIG. 4, compared to the conventional coil, when the position of the reverse circulation portion moves by H, $R_4$ and $\phi_4$ increases. Also, since the gradient field coil has a cylindrical dish-like structure, it can be attached stably to the magnetic pole of the main magnet, and then vibration and noise can be reduced.

It should be understood that the invention is not limited to the illustrated embodiment and that many changes and modifications can be made within the scope of the invention by a person skilled in the art.

According to the MRI system of the present invention, the influence of the reverse magnetic field generated from the gradient field coil is reduced, to thereby enlarge the linear gradient field and the image region thereof, and the gradient field coil can be attached stably to the magnetic pole, to thereby reduce oscillation noise.

What is claimed is:

1. A gradient field coil for generating a gradient field used in a magnetic resonance imaging (MRI) system, said gradient field coil comprising:

a plurality of forward circulation strands; and at least one less reverse circulation strand than the forward circulation strands;

wherein the reverse circulation strand exists at a greater distance and a greater angle from a point on the center axis of the gradient field coil, than the plurality of forward circulation strands.

2. A gradient field coil as in claim 1, wherein the gradient field coil is a dish-like structure having two semi-cylindrical portions.

3. A gradient field coil as in claim 1, wherein the plurality of forward circulation strands cross an inside of a semi-cylindrical portion and the reverse circulation strand is located along a perimeter of said semi-cylindrical portion at said greater distance and said greater angle.

* * * * *